US006878980B2

United States Patent
Gudesen et al.

(10) Patent No.: US 6,878,980 B2
(45) Date of Patent: Apr. 12, 2005

(54) FERROELECTRIC OR ELECTRET MEMORY CIRCUIT

(76) Inventors: Hans Gude Gudesen, Hans Petters vei 7, N-1639 Gamle Fredrikstad (NO); Per-Erik Nordal, Bastadryggen 19, N-1387 Asker (NO)

(*) Notice: Subject to any disclaimer, the term of this patent is extended or adjusted under 35 U.S.C. 154(b) by 144 days.

(21) Appl. No.: 10/301,790

(22) Filed: Nov. 22, 2002

(65) Prior Publication Data

US 2003/0179617 A1 Sep. 25, 2003

Related U.S. Application Data

(60) Provisional application No. 60/333,751, filed on Nov. 29, 2001.

(30) Foreign Application Priority Data

Nov. 23, 2001 (NO) .............................................. 5735/01

(51) Int. Cl.$^7$ ................................................ H01L 29/76
(52) U.S. Cl. ......................... 257/295; 438/3; 438/239; 438/240; 438/608; 438/785
(58) Field of Search ........................... 438/3, 239, 240, 438/608, 785

(56) References Cited

U.S. PATENT DOCUMENTS 6,284,654 B1   9/2001   Roeder et al.
6,686,236 B2 *  2/2004   Aggarwal et al. .......... 438/239

FOREIGN PATENT DOCUMENTS

JP    10022470       1/1998
JP    200068465 B1   3/2000

WO    02/43071 A1    5/2002

OTHER PUBLICATIONS

S.B. Desu, "Minimization of Fatigue in Ferroelectric Films" Department of Materials Science and Engineering, Virginia Tech, Blacksburg, phys. stat. sol. (a) 151, 467–480 (1995). Guerrero, et al. "Growth and Characterization of Epitaxial Ferroelectric $PbZr_xTl_{1-x}O_3$ Thin Film Capacitors with $SrRuO_3$ Electrodes for Non–Volatile Memory Applications" Solid–State Electronics, 2001, No. 45, pp. 1433–1440.

* cited by examiner

Primary Examiner—Hoai Ho
Assistant Examiner—Mai-Huong Tran
(74) Attorney, Agent, or Firm—Birch, Stewart, Kolasch & Birch, LLP (57) ABSTRACT

A ferroelectric or electret memory circuit, particularly a ferroelectric or electret memory circuit with improved fatigue resistance, including a ferroelectric or electret memory cell with a polymer or oligomer memory material contacting first and second electrodes, at least one of the electrodes is comprised of at least one functional material capable of physical and/or chemical bulk incorporation of atomic or molecular species contained in either the electrode or the memory material and displaying a propensity for migrating in the form of mobile charged and/or neutral particles between an electrode and a memory material, something which can be detrimental to both. A functional material with the above-mentioned properties shall serve to offset any adverse effect of a migration of this kind, leading to an improvement in the fatigue resistance of the memory cell. The memory circuit being used in a matrix-addressable memory device where the memory cells are formed in distinct portions in a global layer of a ferroelectric or electret thin-film memory material, particularly a polymer material.

22 Claims, 5 Drawing Sheets

Fig.5a  SUBSTITUTION

Fig.5b  FILLING OF VACANCY

Fig.5c (i)

INTERSTITIAL

FERROELECTRIC OR ELECTRET MEMORY CIRCUIT

This application claims benefit of Provisional application 60/335,751 filed Nov. 29, 2001.

FIELD OF INVENTION

BACKGROUND OF THE INVENTION

The present invention concerns a ferroelectric or electret memory circuit, particularly a ferroelectric or electret memory circuit with improved fatigue resistance, comprising a memory cell with a ferroelectric or electret memory material exhibiting hysteresis and capable of being polarized to a positive or negative polarization state with a given polarization value, wherein the ferroelectric or electret memory material is a polymer or oligomer material, or blends or composites comprising materials of this kind, and with first and second electrodes provided directly or indirectly contacting the memory material in an arrangement such that by applying appropriate voltages to the electrodes, a potential difference can be generated over the memory material for polarizing an unpolarized memory cell, or inducing a switching between a polarization state of the memory cell and the opposite polarization state, or inducing a temporary change in the polarization state or value thereof in the memory cell.

DESCRIPTION OF RELATED ART

During recent years, non-volatile data storage devices have been demonstrated where each bit of information is stored as a polarization state in a localized volume element of an electrically polarizable material. A material of this kind is called an electret or ferroelectric material. Formally ferroelectric materials are a subclass of electret materials and capable of being spontaneously polarized to either a positive or negative permanent polarization state. By applying an electric field of appropriate polarity, it is moreover possible to induce a switching between the polarization states. Non-volatility is achieved since the material can retain its polarization even in the absence of externally imposed electrical fields. The polarizable materials have hitherto typically been ferroelectric ceramics, and the writing, reading and erasing of data has entailed the application of electrical fields to the ferroelectric material in localized cells in the memory devices, causing the material in a given cell to switch or not switch its direction of polarization, depending on its prior electrical history. During normal operation of the device in question, the ferroelectric material may be subjected to electrical field stress of a prolonged or repeated nature and/or numerous polarization reversals. This may cause the ferroelectric material to suffer fatigue. i.e. deterioration of the electrical response characteristics required for normal operation of the device. Fatigue is characterized by a reduction of the remanent polarization, which in turn results in a reduced switching current signal upon induced polarization reversal. Also, the fatigue process is sometimes accompanied by an increased coercive field, which makes the device harder to switch from one polarization state to another and hence slows down the switching process. Another undesirable aging phenomenon is the development of imprint i.e. if a ferroelectric memory cell is left in a given polarization state for a period of time, it may become increasingly difficult to reverse the polarization direction, and an asymmetry develops in the fields required to switch the polarization in either direction.

Resolution of the problems related to fatigue and imprint is essential for successful commercialisation of devices based on ferroelectric or electret materials as discussed here. Much of the effort that has been spent on these issues pertains to devices employing inorganic ferroelectric materials. The latter are essentially based on two families of oxide ferroelectrics, i.e. lead zirconate titanate (PZT) and layered compounds such as strontium bismuth tantalate (SBT) and lanthanum-modified bismuth titanate (BLT). Among these, SBT and BLT exhibit good fatigue-resistance in simple capacitor-like memory cell structures with metal electrodes such as platinum (Pt). However, the switching polarization, and some ferroelectric characteristics of SBT and BLT capacitors are inferior as compared to PZT. Also, these cells require higher manufacturing temperatures. On the other hand, initial attempts to use PZT in conjunction with metal electrodes have proved unsuccessful for most memory applications due to rapid deterioration of switchable polarization with increasing number of read cycles. As a result of intensive research efforts, it was shown that the redistribution of charge defects (e.g. oxygen vacancies) result in charge accumulation at the interfaces, whereby pinning sites are created that inhibit domain switching and bring on fatigue in the devices. A strategy which has proven successful in countering this phenomenon is to employ conductive oxide electrodes, preferably with a lattice structure similar to that of the bulk ferroelectric material, which neutralize the oxygen vacancies that arrive at the electrode/ferroelectric interface. Examples of candidates for electrode materials in the case of oxide ferroelectrics such as PZT are $RuO_2$, $SrRuO_3$, indium tin oxide (ITO), $LaNiO_3$, lanthanum strontium cobaltate (LSCO) and yttrium barium copper oxide (YBCO). An alternative to the above-referred strategy of providing a supply of critical atomic species in the electrodes, is to insert sinks for vacancies in the bulk ferroelectric via doping and/or adjustment of stoichiometries. This approach has been used on PZT by introducing donor dopants such as Nb which substitute into Zr or Ti sites and neutralize the oxygen vacancies.

Further refinements and adaptations to different inorganic ferroelectric compositions have emerged, constituting a large body of prior art relating to inorganic, and in particular ceramic ferroelectric films. For further background information on prior art, the reader is referred to, e.g.: S. B. Desu, "Minimization of Fatigue in Ferroelectric Films", Phys.Stat. Sol. (a) 151, 467–480 (1995); K.-S. Liu and T.-F. Tseng "Improvement of $(Pb_{1-x}La_x)(Zr_yTi_{1-y})_{1-x/4}O_3$ ferroelectric thin films by use of $SrRuO_3$/Ru/Pt/Ti bottom electrodes", Appl.Phys.Lett. 72 1182–1184 (1998), and S. Aggarwal et al.: "Switching properties of $Pb(Nb,Zr,Ti)O_3$ capacitors using $SrRuO_3$ electrodes", Appl.Phys.Lett. 75 1787–1789 (1999). As shall be expounded below, however, the present inventors are not aware of any relevant prior art in the present context of fatigue reduction in devices employing organic or polymeric electrets or ferroelectrics.

As described in patent applications filed by the present applicant, e.g. International published application WO99/12170, organic-based and in particular polymeric ferroelectric materials provide considerable advantages for use in memory and/or processing devices as compared to their inorganic counterparts. However, fatigue and imprint problems do occur in organic-based ferroelectric capacitors, which if not solved will cause serious obstacles for commercialisation. Unfortunately, the remedies that have been developed for counteracting fatigue in inorganic ferroelectrics systems cannot be applied in this case, due to fundamental differences in both the chemistry and in the basic ferroelectric properties (e.g. displacive vs. permanent dipoles). Hence, the present applicant in International published application WO02/43071 has proposed a ferroelectric memory circuit wherein in at least one of the electrodes comprises a conducting polymer contacting a memory material of ferroelectric polymer. Optionally, the conducting polymer layer may also be provided as an interlayer between a conventional metal electrode and the memory material. This arrangement provided improved control of the charge injection properties of the electrode with added benefit of maintaining an adequate fatigue resistance beyond $10^6$ polarization-switching cycles. It is however, regarded as desirable that ferroelectric or for the sake of that electret memories should be impervious to fatigue well beyond $10^9$ polarization-switching cycles. Recently it has also transpired that transport phenomena, i.e. the exchange of for instance ionic species between the electrodes and the memory material, not only may be detrimental to both, but in addition also may have adverse effects on the fatigue resistance of the memory material.

Thus, there exists a pressing need for strategies and remedies that minimize fatigue processes in memory and/or processing devices based on organic and in particular polymeric electrets or ferroelectrics.

SUMMARY OF THE INVENTION

In accordance with the above, a major object of the present invention is to provide basic strategies for reducing and/or avoiding the effect of fatigue caused by electrical field stress in memory circuits with organic electret or ferroelectric materials employed and as applied in devices for data storage and/or processing.

It is a further object of the present invention to provide explicit descriptions of memory circuit structures where certain basic fatigue mechanisms are prevented or delayed from becoming operative.

It is yet an object of the present invention to enumerate particular classes of materials for incorporation in fatigue-resistant memory circuits and list a number of preferred embodiments of particular relevance.

The above objects and further features and advantages are achieved according to the present invention with a ferroelectric or electret memory circuit characterized in that at least one of the electrodes comprises at least one functional material selected among one or more of the following, viz. a diamond-like nanocomposite thin-film material, a conducting carbide material, a conducting oxide material, a conducting boride material, a conducting nitride material, a conducting silicide material, a conducting carbon-based material, or a conducting polymer or copolymer material, said at least one functional material being capable of physical and/or chemical bulk incorporation of atomic or molecular species contained in either the electrode material or the memory material of the memory cell and displaying a propensity for migrating in the form of mobile charged and/or neutral particles from an electrode material into the memory material or from the latter into the former, whereby an adverse effect on the functional properties of either the electrode material or the memory material of the memory cell can be offset.

In the present invention it is considered advantageous that said at least one functional material either separately or in conjunction respectively has electrical and/or chemical properties compatible with those of the electrode material; a relative permittivity about equal to or greater than that of the memory material; a relative permittivity that remains substantially unchanged upon incorporation of said atomic or molecular species; and a conductivity that remains substantially unchanged upon incorporation of said atomic or molecular species.

In a first preferred embodiment according to the present invention said at least one functional material is provided evenly distributed in the electrode material. In a variant of this preferred embodiment said at least one functional material is provided in a portion of the electrode material extending to a surface of said at least one electrode and contacting the memory material. In case of two or more functional materials are used, these can then be provided in respective separate strata of said portion of the electrode material.

In a second preferred embodiment of the memory circuit according to the invention said at least one functional material is provided in one or more surface layers of said at least one electrode, said one or more surface layers being provided as one or more interlayers between said at least one electrode and the memory material, and in case two or more functional materials are used, these can then be provided in respective two or more interlayers.

In that connection a conducting carbide material can be one or more of the following, viz. tantalum carbide, titanium carbide, zirconium carbide, or hafnium carbide; a conducting oxide material one or more of the following, viz. binary oxides, ternary oxides, doped or undoped binary oxides, or doped or undoped ternary oxides; a conducting boride material one or more of the following, viz. hafnium boride, zirconium boride, or chromium boride; a conducting nitride material one or more of the following, viz. titanium nitride, zirconium nitride, hafnium nitride, tantalum nitride, vanadium nitride, niobium nitride or chromium nitride; a conducting silicide material can be titanium silicide; or a conducting carbon-based material one or more of the following, viz. graphitic carbon, fullerenes or substances with cyano (CN) entities.

Advantageously the conducting polymer or copolymer material can be selected as one or more of the following, viz. doped polypyrrole (PPy), doped derivatives of polypyrrole (PPy), doped polyaniline, doped derivatives of polyaniline, doped polythiophenes, and doped derivatives of polythiophenes.

Advantageously a ferroelectric or electret polymer memory material can be selected as one or more of the following, viz. polyvinylidene fluoride (PVDF), polyvinylidene with any of its copolymers, ter-polymers based on either copolymers or PVDF-trifluoroethylene (PVDF-TrFE), odd-numbered nylons, odd-numbered nylons with any of their copolymers, cyanopolymers, and cyanopolymers with any of their copolymers.

Advantageously the electrode material can be selected as one of the following, viz. aluminium, platinum, gold, titanium, copper, or alloys or composites thereof.

Advantageously the memory material is provided in the memory circuit by means of physical or chemical vapour deposition, or by means of spin- or dip-coating processes, the electrode material being provided in the memory circuit by means of physical or chemical vapour deposition, and said at least one functional material being provided in the memory circuit by means of physical or chemical vapour deposition or a solution-based process. Preferably the memory material, the first and the second electrode and if appropriate, said at least one interlayer are then all provided as thin films in the memory circuit, thus realizing the latter as a substantially thin-film device.

Advantageously a plurality of ferroelectric or electret memory circuits according to the invention forms the memory circuits in a matrix-addressable array, the memory cells of the memory circuits form distinct portions in a global layer of a ferroelectric or electret thin-film memory material, the first and second electrodes form portions of first and second electrode means respectively, each electrode means comprising a plurality of parallel strip-like electrodes with the electrodes of the second electrode means being oriented at an angle, preferably orthogonally, to the electrodes of the first electrode means, and the ferroelectric or electret thin-film global layer is sandwiched therebetween, such that the memory cells of the memory circuits are defined in the thin-film global layer at the crossings of respectively the electrodes of the first electrode means and the electrodes of the second electrode means, whereby the array of memory circuits formed by the electrode means and the global layer of the memory material with the memory cells realizes an integrated passive matrix-addressable ferroelectric or electret memory device wherein the addressing of respective memory cells for write and read operations take place via the electrodes of the electrode means in suitable connection with external circuitry for driving, control and detection.

DESCRIPTION OF THE DRAWINGS

The invention shall now be described in more detail, with reference to preferred embodiments and in conjunction with the appended drawing figures, of which

DETAILED DESCRIPTION OF THE INVENTION

The present invention is generally based on introducing into the memory circuit, which is a generic capacitor-like structure, at least one functional material such that it interfaces the electret or ferroelectric memory material on the one hand and the electrodes of the capacitor-like structure on the other hand. Hence the at least one functional material could be a constituent of the electrodes. The functional material is electrically conducting and therefore may be viewed as an additional electrode material in the capacitor-like structure. An important attribute of a functional material in addition to being electrically conducting is that it is able to capture and incorporate into its structure certain ionic or neutral species that migrate from the electret or ferroelectric material under the influence of the electric field being imposed on the capacitor-like structure via the electrodes or under the influence of concentration gradients. As shall become apparent from the more detailed description to follow, such capture and incorporation of ions or neutral species take place either interstitially, or by substitution of atomic or molecular constituents of the functional material, or by filling of vacancies therein. Chemical binding to reactive species purposely built into the electrode structure is also possible. In all cases the functional material shall remain electrically conducting.

Figure 1:
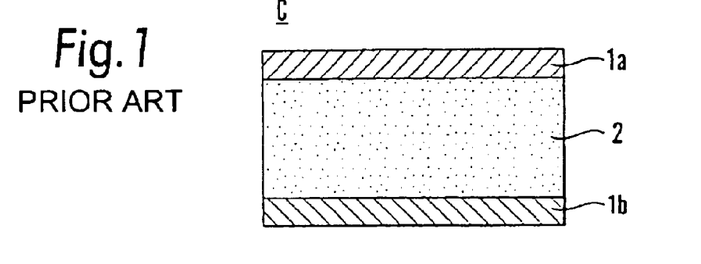
FIG. 1 shows a generic memory circuit of relevance to the present invention, representing e.g. an elementary memory cell in a data storage device as disclosed in prior art, FIG. 2 a memory circuit according to a first preferred embodiment of the present invention, FIG. 3 a memory circuit according to a second preferred embodiment of the present invention, FIG. 4 a memory circuit according to a variant of the second preferred embodiment of the present invention, FIGS. 5a–c generically illustrate certain different modes of ion incorporation of a functional material, FIG. 6a a plan view of a matrix-addressable memory device comprising memory circuits according to present invention, FIG. 6b a cross section of the device in FIG. 6a taken along the line x—x, FIG. 6c detail of a memory circuit of the device in FIG. 7a and corresponding to the embodiment in FIG. 3, and FIG. 7 schematically the structure of a functional material in the form of a diamond-like nanocomposite (DLN) film as used in the present invention.

In conjunction with the present invention one has undertaken extensive investigations into the causes of fatigue and imprint in polymeric memory materials employed in capacitor-like memory circuits for data storage and processing applications, as shown in FIG. 1. The memory circuit C comprises first and second electrodes 1a;1b interfacing a memory material 2, in this case a ferroelectric polymer sandwiched between two electrodes in a parallel-plate capacitor-like structure. By applying a voltage signal between the electrodes, the ferroelectric polymer is subjected to electrical fields that may affect or interrogate its polarization state. Although claimed to be generally applicable for organic and polymeric electrets and ferroelectrics, the subsequent discussion shall primarily treat polymeric ferroelectrics, with emphasis on PVDF and its co- and/or ter-polymers with TrFE and/or TFE. This in order to provide focus and concreteness to the presentation and to encompass classes of materials that appear of particular relevance for future devices of interest.

Based on experimental and theoretical evidence, the inventors have found that a generally recurring, ubiquitous and dominant mechanism for fatigue and imprint is redistribution of charged impurity species in the bulk of the ferroelectric polymer and near the electrode regions, under the influence of electrical and chemical potentials. Upon arriving at the ferroelectric/electrode interface, such impurities may be captured by deep traps at the ferroelectric/electrode interface or react chemically with the electrode material. The impurities may create reaction products, which form insulating barrier layers at the electrodes and traps for ionic species that subsequently arrive at the electrodes. Depending on the depth of the traps, localized charges may build up at the electrode surfaces and damage the function of the cell by creating depolarization fields and thus pinning of ferroelectric domains. Chemical reactions between ionic or neutral species and electrodes may also destroy the physical integrity of the electrodes and render them non-functional by reducing their conductivity to unacceptably low levels.

Thus, ferroelectric activity is lost by secondary effects associated with the accumulation of defects at the electrodes or at the internal interfaces in the bulk of the ferroelectric memory material (i.e. domain boundaries, or boundaries between amorphous and crystalline regions, or grain boundaries). These defects, (e.g. ionic species) may either be present a priori as foreign impurities in the ferroelectric material from the synthesis or film manufacturing process, or be derived from the degradation of the ferroelectric due to various forms of stress occurring during the manufacturing of the memory cells or subsequent electrical or mechanical stresses relating to the operation of the devices.

The remedies found to be efficacious against the above deleterious phenomena and which constitute the present invention to be described and exemplified below, differ fundamentally from those developed for the above referred inorganic ferroelectric memory films where volatile constituents, e.g. oxygen in PZT, are lost during the switching of the ferroelectric. In those cases, remedies are focused on filling vacancies by replacing lost species such as oxygen, and by suppressing vacancy generation by doping or stoichiometric modification of the bulk ferroelectric.

According to an embodiment of the present invention, the electrodes contacting the ferroelectric are prepared so as to capture e.g. ions arriving at the electrode/ferroelectric memory material interface, and to incorporate said ions into the electrode structure without loss of electrical conductivity in the electrode material. This is achieved by judicious selection of electrode materials, where each electrode may be a single monolithic sheet or film, or where each electrode is created as a sandwich structure containing two or more functional layers. Desired functionalities of the overall electrode structure are as listed below, viz.

i. Electrical conductivity.
ii. Trapping/incorporation of deleterious ionic species.
iii. Barrier activity against penetration of electrodes by impurities migrating towards the electrodes from the ferroelectric.
iv. Barrier activity against migration of charged or neutral species into the ferroelectric from the electrodes.

Here, electrical conductivity ensures that ionic species arriving at the electrodes from the bulk ferroelectric memory material are neutralized. Thus charge is not allowed to accumulate, which could create strong local domain pinning fields or significant depolarizing fields in the bulk ferroelectric. Incorporation of ions in the electrode structure ensures that neutralized ions do not accumulate at the electrode/ferroelectric interface, which otherwise could create a nonconducting barrier layer and even cause structural damage. Finally, good barrier properties provide protection against penetration of chemically aggressive impurities from the bulk ferroelectric that might chemically attack the backing electrode material or other constituents of the memory device, or less aggressive impurities that could still cause damage by structural dislocation of parts of the device (e.g. pressure being exerted by evolved gas).

Figure 2:
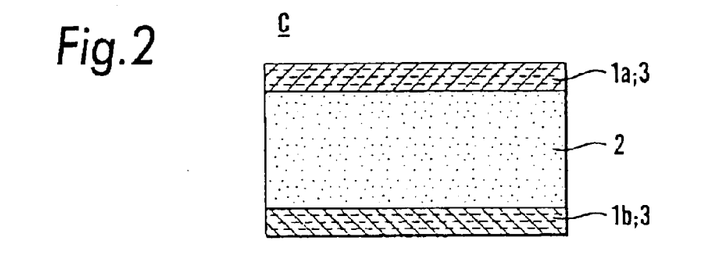

FIG. 2 shows a first preferred embodiment of a memory circuit according to the invention, where a single electrode material provides all the most important functionalities of the electrodes $1a$, $1b$. In this case the functional material can be considered distributed evenly in the electrode material. Alternatively the functional material 3 can be provided in a portion of the electrode material in an electrode $1a;1b$. This portion must then extend to the surface of the electrode $1a;1b$ contacting the ferroelectric memory material 2 of the memory cell in order to have the intended effect. In this case two or more functional material can be provided in respective strata of this portion, i.e. provided in a stratified arrangement in the electrode material. From the above it will be seen that in the first embodiment the incorporation of the functional material in the electrode material proper eliminates the need for using separate and distinct interlayers of functional material, as is the case of the second embodiment as respectively shown in FIGS. 3 and 4. The actual provision of electrodes $1a,1b$ incorporating the functional material 3 in the first embodiment may entail more difficult processing problems than is the case of a second embodiment described in the following. The process requirements for providing the various materials and layers in the memory circuit according to the invention shall, however, briefly be discussed further below. Clearly, this first embodiment requires electrode material of exceptional qualities, but as shall be exemplified below, such materials exist.

Figure 3:
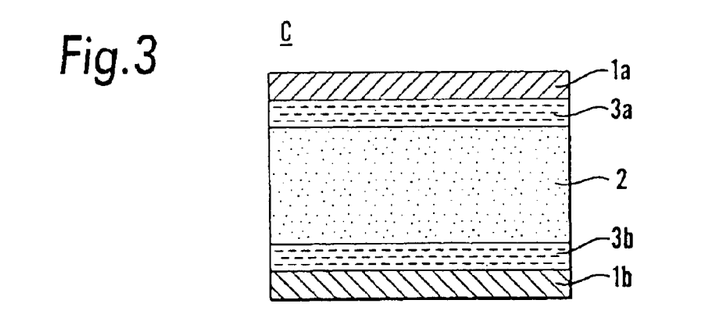

FIG. 3 shows a memory circuit according to a second preferred embodiment of the invention. It has a capacitor-like structure where the different desired functionalities of the electrodes $1a$, $1b$ are taken care of by two separate interlayers $3a;3b$ of functional material 3. These interlayers $3a;3b$ are sandwiched between the electrodes $1a;1b$ and the memory material 2. The interlayers $3a;3b$ comprise functional material 3 which is electrically conducting and which can incorporate into its structure without loss of electrical conductivity ionic species that migrate to the electrodes $1a;1b$ from the ferroelectric memory material 2 of the memory cell C. A highly conducting electrode material forms the electrodes $1a;1b$ and provides good electrical connectivity to external driving and sensing circuits. The electrodes $1a$; $1b$ are coated with a conducting ion trapping functional material 3 forming the interlayers $3a;3b$ on the side facing the ferroelectric memory material 2. The ion trapping layers $3a;3b$ exhibit good barrier properties against the ionic species such that penetration and chemical attack on the backing electrode material and possibly other constituents of the memory circuit C are prevented. This separation of functionalities in different interlayers may be extended to structures containing more layers still, thus widening the range of electrode materials that may be used and improve performance and/or manufacturability. For instance may the interlayers $3a;3b$ be constituted by a number of sublayers respectively, each comprising a specific functional material and hence tailored to a specific function such as one of those listed under ii)–iv) in page 9.

Figure 4:
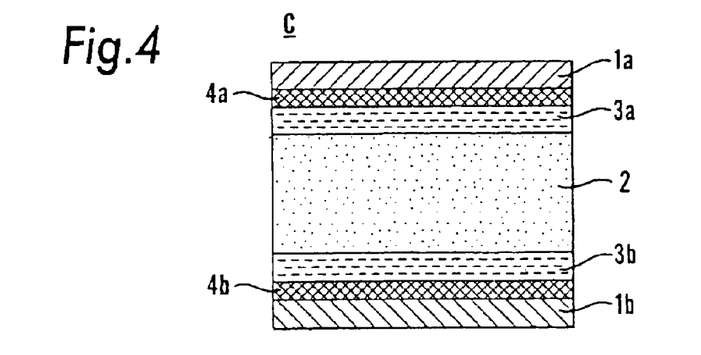

A variant of the second preferred embodiment of a memory circuit according to the invention is shown in FIG. 4, depicting the use of two separate interlayers $3a;4a$ and $3b$; $4b$ on either side of the memory cell C. The interlayers $3a,3b$ facing the ferroelectric memory material 2 are electrically conducting and have the ability to absorb impurities from the ferroelectric memory material 2. The interlayers $4a,4b$ likewise comprise a functional material 3 which is conducting and has good barrier properties, preventing the transfer of impurities through to the electrode layers $1a,1b$, which are highly conducting material, e.g. a metal providing connection to other parts of the circuitry in the device. The latter could advantageously be the conductor material used in other parts of the same device, to simplify the manufacturing process.

Figure 5A:
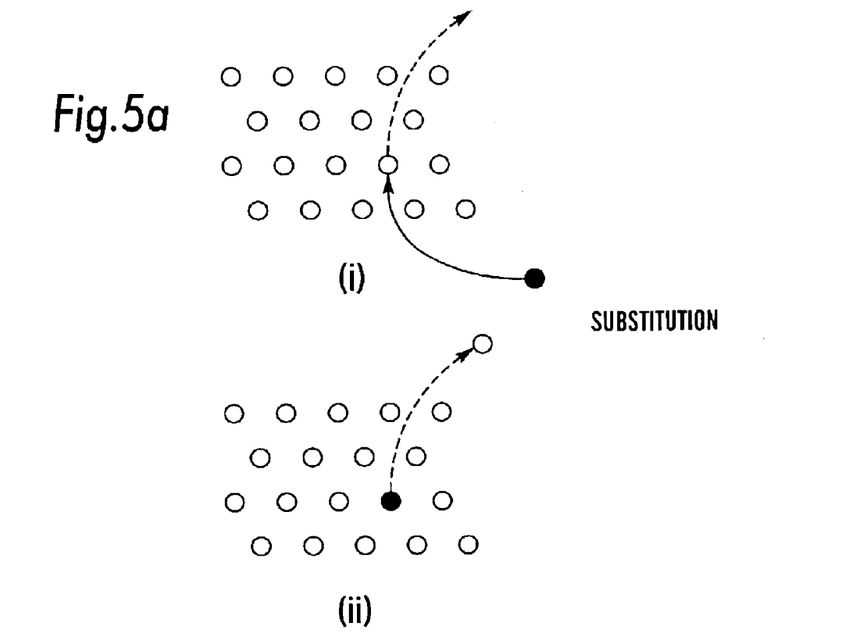
Figure 5B:
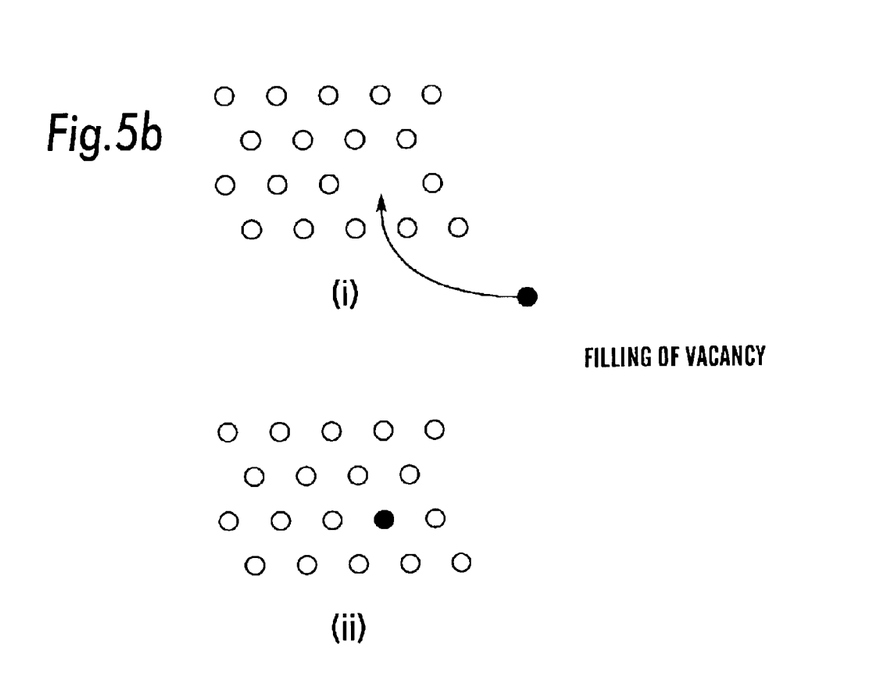
Figure 5C:
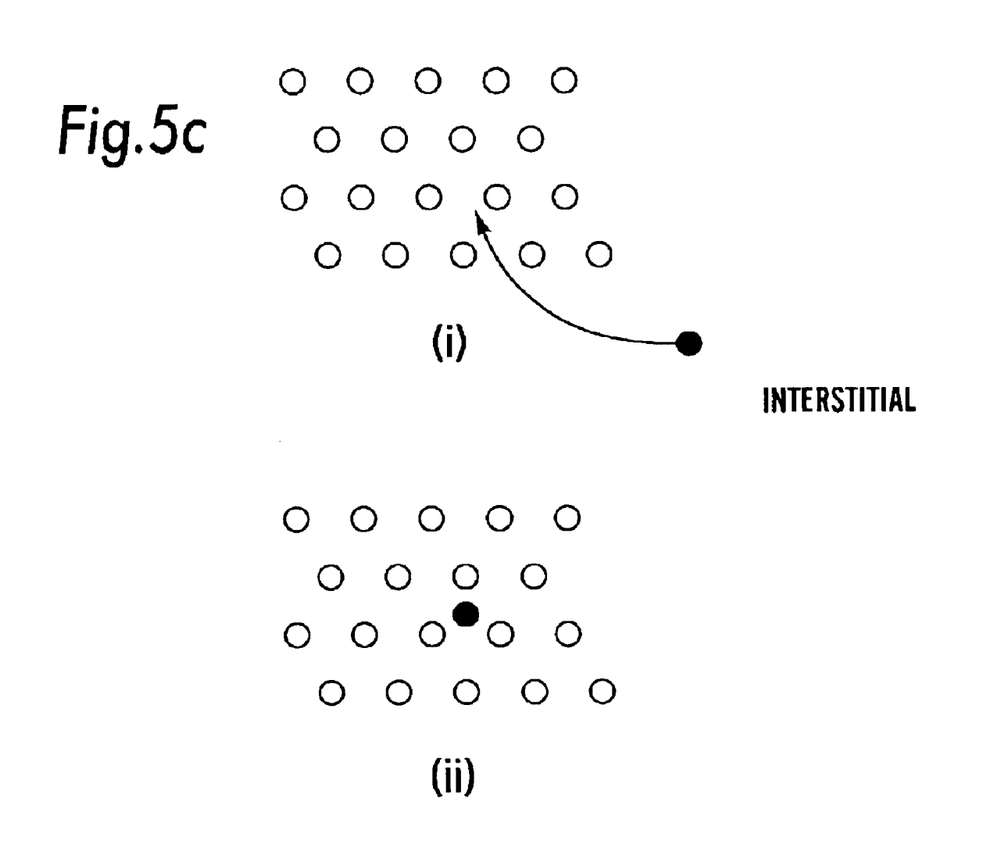

The operating principle of a functional material shall now be described in some detail. Ionic and neutral impurity species can be incorporated into the electrode structure in several ways, as illustrated schematically in FIGS. 5a, 5b and 5c. Substitution, as shown in FIG. 5a (i) and FIG. 5a (ii) implies that the impurity dislodges a native constituent of the functional material and takes its place. The freed native constituent in its turn may migrate to another site where it is bound anew, e.g. by any of the mechanisms depicted in either these figures or the following FIGS. 5b, 5d. FIG. 5b(i) and FIG. 5b(ii) show incorporation by the filling of a vacancy, and FIG. 5c(i) and FIG. 5c(ii) interstitial placement. In all of these cases, it should be noted that a certain mobility exists for atoms and vacancies in the functional material. Thus, even a dense material with good barrier properties may accommodate impurities in depth, i.e. beyond its first monolayer at the interface against the ferroelectric memory material 2, through atomic and molecular rearrangement.

The strategies described above implicitly restrict the range of acceptable manufacturing processes providing the memory cell of ferroelectric memory material 2 either with electrodes $1a,1b$ including a functional material 3 or alternatively with interlayers 3a,3b of the functional material 3, as well as the materials and processes that may be chosen for creating the device as such. Thus, harsh cleaning and coating procedures that create high incidence of impurities or chemical and physical defects at the various layer or material interfaces must be avoided.

Clearly, there must be a limit to the amount of impurities that can be incorporated into the electrode structure before it starts to lose its desirable properties. However, it is worth noting that extension of device life, not necessarily infinite time to failure, is what is sought for in most cases. Also, in many instances the main problem may be due to an initial population of impurities originating from the materials synthesis or device manufacturing process. When swept up and accommodated either in the electrode, or in a separate interlayer this population ceases to be a problem, permitting stable operation of the device for an extended period thereafter.

Advantageously the functional material or materials should have electrical and/or chemical properties compatible with those of the electrode material and this applies irrespective of whether the functional material is provided distributed in the electrode material or as a surface layer thereof. The implication is particularly that the functional material shall be chemically compatible with regard both to the electrode material and a ferroelectric or electret memory material. This also means that the functional material after incorporation of migrating atomic or molecular species from either the electrode material proper or the memory material still should retain its original electrical and chemical properties and particularly appear as compatible in either sense with both the electrode material and the memory material. It will also commonly be required that the functional material or the the functional materials as used, whether distributed in the electrode material and particularly when provided as surface layers thereof, or provided as interlayers between the electrode and the memory material, should have a high-frequency relative permittivity that is about equal to or longer than that of the memory material so as to avoid the electrical attenuation between a memory material and an electrode material. Although conducting, the relative permittivity of a functional material could be appreciably less than that of the electrode material, but preferably higher than the ferroelectric memory material and this property should remain unchanged when migrating atomic or molecular species are incorporated. Neither should the conductivity of the functional material change upon an incorporation of this kind.

Figure 6A:
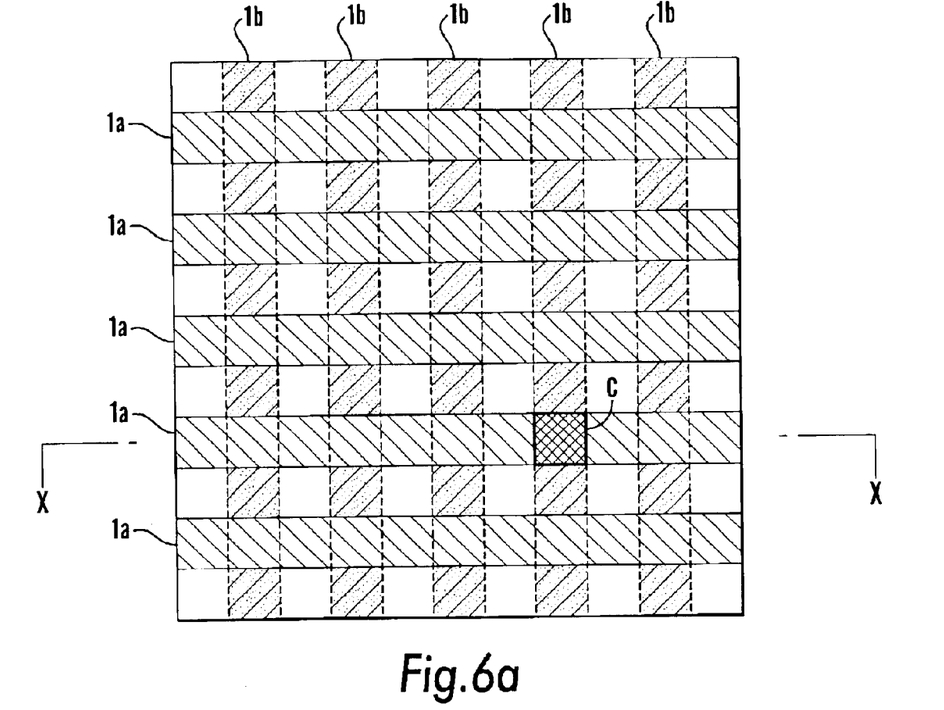
Figure 6B:
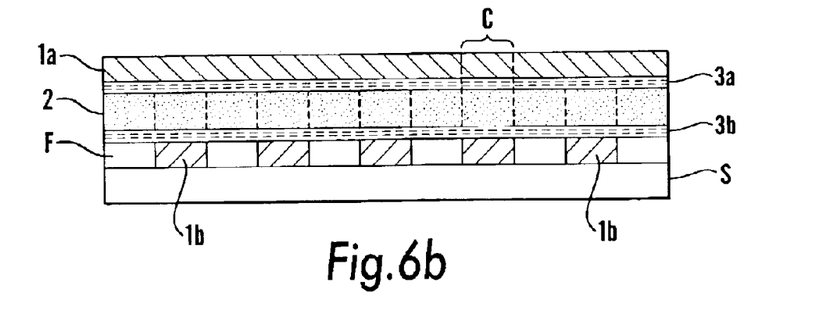
Figure 6C:
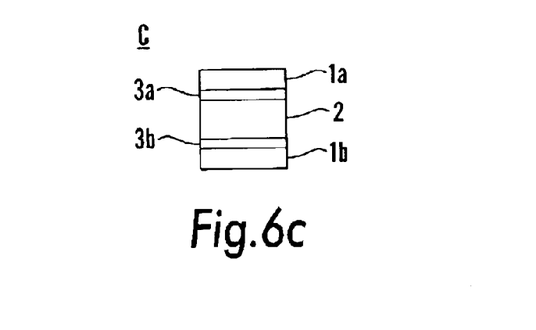

The memory circuit according to the present invention could be employed as memory circuits in a matrix-addressable array of such memory circuits. In other words they would constitute a passive matrix-addressable memory device as shown in plan view in FIG. 6a and in cross section taken along line X—X in FIG. 6b. The memory device is termed a passive matrix device since there are no switching transistors connected to a memory circuit for switching a memory cell C on and off in an addressing operation. This would imply that the memory material of the memory cell C in its unaddressed state has no contact with any of the addressing electrodes of the matrix-addressable device. Basically a memory device of this kind is formed with a first set of parallel strip-like electrodes 1b, which in FIG. 6b is shown located on a substrate and covered by an interlayer 3b of functional material followed by a global layer of ferroelectric memory material, i.e. a ferroelectric polymer 2, which in its turn is covered by a global layer 3a of functional material over which are provided another electrode set comprising likewise parallel strip-like electrodes 1a, but oriented orthogonally to the electrodes 1b, so as to form an orthogonal electrode matrix. The electrodes 1a can e.g. be regarded as the word lines of a matrix-addressable memory device, while the electrodes 1b can be regarded as the bit lines thereof. At the crossings between the word lines 1a and bit lines 1b a memory cell is defined in the matrix in the global layer of memory material 2. Thus the memory device will comprise a plurality of memory circuits C corresponding to the number of electrode crossings in the matrix. The memory circuit C is shown in more detail in cross section in FIG. 6c and corresponds to the second preferred embodiment of the memory circuit according to the present invention. In other words the functional material 3 is provided in respective interlayers 3a, 3b which interfaces respectively electrodes 1a and 1b with the memory material 2 sandwiched therebetween. It shall be understood that a memory device of the kind shown in FIGS. 6a and 6b can be provided with an insulating layer over the electrodes 1a (or a so-called separation layer) and then a second similar device can be stacked on the top thereof and so on to form a stacked or volumetric memory device as known in the prior art. It is to be understood that electrodes 1a, 1b forming the respectively word and bit lines in the memory device in FIG. 6a all will be connected with suitable driving and control and sensing circuits for performing write/read operations to the memory cells of the matrix-addressable memory device, although the peripheral external circuitry is not shown in the drawing figures.

Providing a functional material in a matrix-addressable memory device of this kind requires some attention to production detail. For instance the bit line electrodes 1b could be located on a substrate S and initially deposited as a global layer covering the substrate whereafter the electrodes are patterned e.g. in a standard photolithographic process to form the strip-like bit line electrodes 1b. Alternatively parallel recesses with a cross section corresponding to an electrode 1b could be formed in the substrates and then filled with appropriately processed electrode material which if required could be planarized until the electrode top surfaces become flush with that of the substrate. When the functional material 3 is incorporated in the electrode material, a physical or chemical vapour deposition can be employed to deposit both materials in order to achieve a simultaneous or gradual incorporation of functional material in the electrode material. Alternatively, in following separate steps either a layer 3b or functional material could be laid down as a global layer in the memory device and then the global layer 2 of memory material is deposited before another global layer 3a of functional material is provided covering the global layer of memory material 2. Finally word line electrodes 1a are provided as shown in FIG. 6a and possibly covered by a planarization layer with insulating and separating function. The resulting structure is of course a memory device integrating a plurality of memory circuits C according to the present invention in a passive matrix-addressable memory array. When the functional material 3 is provided in respective interlayers 3a, 3b both these layers as well as the memory material 2 are provided as global, i.e. unpatterned layers in the memory device, thus allowing the integration of a single memory circuit into an array of such memory circuits the number of which can run into tens or hundred of millions or even more with the capacity to store the same number of bits as a predetermined polarization state or value of each separate memory circuit. Moreover, a matrix-addressable memory device of this kind can by suitable arrangement of the external circuitry for write and read perform a write or read operation on a hugely massive parallel scale.

Various examples of functional materials which can be used in the memory circuit according to the invention shall now be given, with explicit descriptions of functional material or interlayers thereof that are suited for use with fluorine-containing memory materials. This emphasis is based on the fact that certain fluorine-containing polymeric ferroelectrics, in particular PVDF and copolymers of VDF and TrFE show particular promise as memory materials in future data storage devices. It is also a fact that fluorine-containing memory materials pose exceptional challenges due to the mobility and chemical aggressiveness of fluorine and hydrogen fluoride in neutral as well as ionic form.

EXAMPLE 1

Electrodes with a Diamond-Like Nanocomposite (DLN) Film

During recent years, a new type of films have been developed where very good corrosion resistance and barrier properties are combined with an electrical conductivity which can be adjusted over 18 orders of magnitude by varying the composition during film growth (cf., e.g. "Method for forming Diamond-Like Nanocomposite or Doped-Diamond-Like Nanocomposite Films", U.S. Pat. No. 5,352,493 (1994); (Veniamin Dorfman and Boris Pypkin)). Termed Diamond-Like Nanocomposite (DLN) carbon film, these films are somewhat similar to the more well-known diamond-like carbon (DLC) films (cf., e.g. "Method of forming Diamond-like Carbon Coating in Vacuum", International published application WO98/54376 (A. I. Maslov & al.), but consists of interpenetrating random networks of predominantly diamond bonded carbon stabilized with hydrogen, and glass-like silicon stabilized by oxygen. This C-Si self-stabilized amorphous structure forms the matrix for introduction of metals which form a third interpenetrating network that can provide resistivities down to $10e^{-4}$ $\Omega$cm. Depending on the desired properties, metals can be selected from a wide range including Li, Ag, Cu, Al, Zn, Mg, Nb, Ta, Cr, Mo, W, Rh, Fe, Co, and Ni. These films can be deposited at high rate on almost any substrate material, subjecting the latter to only mild temperature rise (room temperature deposition temperature). Adhesion is good to virtually all materials of relevance in the present context, i.e. inorganic as well as organic and polymeric materials for use as electrodes and ferroelectrics (e.g.: metals, oxides, ceramics, plastics). Good observed adhesion to Teflon is relevant in connection with the chemically closely related polymeric ferroelectrics such as PVDF and its copolymers with TrFE.

An important feature of DLN films is the possibility to tailor microstructural as well as chemical properties to each given application. As an example, consider the problem of incorporation of aggressive species that migrate from the ferroelectric towards an electrode surface consisting of DLN. As described in the above-referred literature, the DLN contains a web of interpenetrating sub-networks. These sub-networks may be chosen so as to fulfil different requirements of the electrode structure, i.e. structural integrity, barrier properties, electrical conductivity and accommodation of impurities from the ferroelectric memory material.

Figure 7:
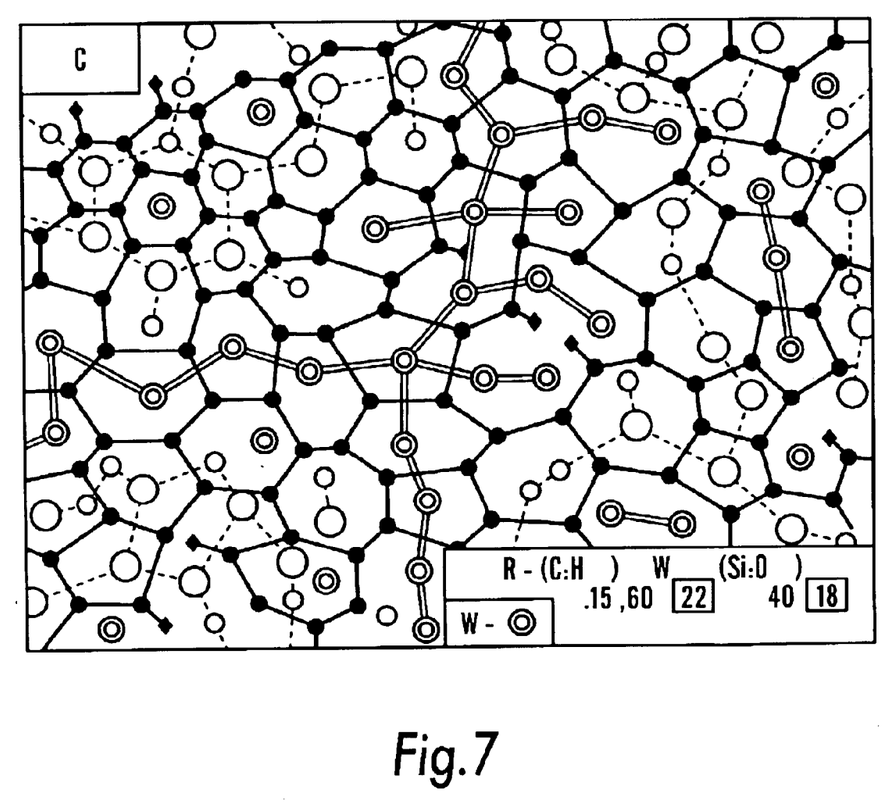

Consider, specifically the structure of DLN film as shown in FIG. 7. One network consists of predominantly sp$^3$ bonded carbon stabilized by hydrogen, constituting a structural backbone. Another network consists of silicon stabilized by oxygen, intertwined with the C—H network and together with the latter providing mechanical strength and barrier properties for the overall electrode structure. Thirdly, there is a network of dopant elements or dopant compounds with elements selected from groups 1–7b and 8 of the periodic system. These dopants are accommodated in a network of nanopores formed in between the other two networks and are in this case a metal at a density above the percolation limit, providing electrical conductivity and adding to the barrier properties of the combined network structure. Other dopants may also be incorporated in a controlled manner during the DLN manufacturing process; thus dopant concentration gradients within the depth of the film may be created. Assume now that the impurities to be dealt with are, e.g., F$^-$ ions and hydrogen fluoride, which would be of relevance in connection with PVDF and P(VDF-TrFE) ferroelectrics. Upon arriving at the electrode interface represented by the DLN film, the impurities would enter the nanopore network and become immobilized there. Trapping inside the network may take place by any of the generic mechanisms illustrated in FIGS. 5a–c. As is apparent to persons skilled in physics and chemistry, the structure in FIG. 7 offers an extraordinary range of opportunities for selecting preferred trapping mechanisms. Typically, deep traps are desired for permanent immobilization. One way of achieving this is to provide sites inside the electrode material that exhibit strong chemical reactivity with the impurity species, e.g. fluorine, and where the reaction product remains locked into the structure with no deleterious effects on the functionality of the electrode. In the example here, one notes that not only dopants in the nanopore network, but also the oxygen-stabilized silicon network itself can serve as sacrificial reactive species in the electrode structure. For example, HF acid is known to selectively etch the Si—O network in DLN (cf. V. Dorfman: "Diamond-like nanocomposites (DLN)", Thin Solid Films 212 267–273 (1992).

EXAMPLE 2

Conducting Carbide as Functional Material

The transition metal carbides have high melting points, show good wear resistive properties and are chemically stable. Many of the transition metal nitrides are also good conductors. Here, emphasis is made on tantalum carbide (TaC), titanium carbide (TiC), zirconium carbide (ZrC) and hafnium carbide (HfC). Especially TiC is of interest to combine with the present Ti electrodes. These compounds forms in the NaCl structure and have a complex combination of metallic, covalent and smaller amounts of ionic bonds. The resistivity depends on the crystalline perfection and is typically 30–50·10$^{-8}$ $\Omega$m.

Thin films of this material are typically formed using glow discharge techniques e.g. reactive magnetron sputtering. Methods to form good quality films are well developed and the materials are for instance, used as diffusion barriers, wear resistive coatings, and optical coatings.

EXAMPLE 3

Conducting Oxide as Functional Material

This includes binary or ternary oxides, doped/undoped. Typical deposition techniques are CVD/spin (Sn2O3:In, SnO2:F, ZnO:Al) and sputtering (LSMO, RuO, IrO$_2$, ITO).

EXAMPLE 4

Conducting Boride as Functional Material

This includes HfB, ZrB, CrB.

EXAMPLE 5

Conducting Nitride as Functional Material

Nitride compounds have conductivities covering a wide range making the materials metallic, semi-conducting or insulating. Especially the transition metal nitrides have attracted a large scientific interest. These materials have high melting points, show good wear resistive properties and are chemically stable. Many of the transition metal nitrides are also good conductors. Here, emphasis is made on the group-4A nitrides; titanium nitride (TiN), zirconium nitride (ZrN) and hafnium nitride (HfN). Especially TiN is of interest to combine with Ti electrodes. These compounds forms in the NaCl structure and have a complex combination of metallic, covalent and ionic bonds. The resistivity depends on the crystalline perfection and is typically 20–30·$10^{-8}$ Ωm. Thin films of this kind are typically formed using glow discharge techniques, e.g. reactive magnetron sputtering. Methods to form good quality films are well developed and the materials are, for instance, used as diffusion barriers, wear resistive coatings, and optical coatings. In addition group-5A nitrides such as TaN, VN, NbN and group-6A nitrides such as CrN may be used.

For relevant literature, see, e.g.: *Transition metal carbide and nitrides* by Louis E. Toth, Academic Press 1971; Papers by J. E. Greene, J. E. Sundgren, L. G. Hultman, etc.

EXAMPLE 6

Conducting Polymer as Functional Material

The first highly conducting polymers were synthesized about 25 years ago with the development (H. Shirakawa) of a silvery all-trans polyacetylene (PA) and later doping (H. Shirakawa, E. J Louis, A. G. MacDiarmid, C. K Chiang and A. J. Heeger; *J. Chem. Soc. Chem. Comm.* (1977) 579) of the same material using e.g. $I_2$. The conductivities in these films were found to be in the order of $10^3$ (Ωcm)$^{-1}$. Soon it was also discovered that other conjugated polymers like poly(p-phenylene) (PPP), polypyrrole (PPy), poly(p-phenylenevinylene) (PPV), polythiophene (PT) and polyaniline (PANI) were possible to dope. However, a drawback with these materials was that they were not processable.

In the middle of the 80's it was demonstrated that conjugated polymers could be processable (both soluble and meltable) when alkyl side chains were added to polythiophene giving poly(3-alkylthiophene) (P3AT). Possibilities to dope these materials were also demonstrated (Sato, Tanaka, Kaeriyama; *Synthetic Metals* 18 (1987) 229), but the stability was poor (G. Gustafsson, O. Ingands, J. O. Nilsson, B. Liedberg, *Synthetic Metals* 31 (1988) 297).

In the years to come the conducting polymers were further developed giving material that were processable (e.g. polyaniline dodecylbenzenesulfonic acid, PANI DBSA) and soluble (e.g. poly(ethylenedioxythiophene) with polystyrenesulfonic acid, PEDOT-PSS) also in the doped state. Today conducting polymers with conductivities ranging from $10^2$ (?) to $10^5$ (Ωcm)$^{-1}$ are commercialized for large number of applications.

EXAMPLE 7

Conducting Silicide as Functional Material

This includes $TiSi_2$.

EXAMPLE 8

Other Types of Functional Materials

These include graphitic carbon, fullerenes such as C60 (buckminster fullerene) and substances with a cyano entity (CN) as a functional group.

In the memory circuit according to the invention the memory material in the memory cell is preferably a ferroelectric or electret memory material. This material advantageously can be polyvinylidenedifluoride-trifluoroethylene (PVDF-TrFE) which presently can be considered the most widespread and best understood polymer memory material. The memory material shall be interfaced between electrodes to form a complete memory circuit and these electrodes are usually metallic, preferably made of aluminium, platinum, titanium, copper or alloys of composites of these. The electrode material shall in any case exhibit good electrical conductivity. One problem in this connection that is well-understood by persons skilled in the art and has been much discussed in the literature is the need for providing the electrodes as a metallization directly on the polymer memory material which has inherently a much lower melting point than the electrode material. Basically the same problem also appears when the functional materials according to the invention of the various preferred types discussed above shall be provided in the memory circuit of the invention. This problem manifests itself somewhat differently depending on the actual further embodiment to be realized. Generally the electrode material of a first electrode, say 1*a*, is provided in the memory circuit, e.g. by being deposited on a not shown substrate by means of physical or chemical vapour deposition. In the first embodiment shown in FIG. 2 the functional material can then be included also in a similar vapour deposition process resulting in the formation of an electrode 1*a* comprising the functional material evenly distributed in the electrode material. As an alternative, unmixed electrode material in an initial stage of the process deposited by physical or chemical vapour deposition as before, whereafter a functional material is added in increasing amounts in following process stages. The deposition of more than one functional material can then take place in different process stages resulting in a stratified or graded distribution of these materials in a portion of the electrode material adjacent to its surface where a subsequent deposition of the memory material can take place by spin-or dip-coating processes. Since the memory material with its low melting point now is deposited on a solidified layer of electrode material incorporating one or more functional materials, there usually will be no problems in a subsequent process step with either thermal or chemical compatibility. However, when a second electrode e.g. 1*b* with one or more admixed functional materials shall be deposited on the polymer memory material, special care should be taken to avoid this further deposition process having detrimental influences on the already provided polymer memory material. Thus physical or chemical vapour deposition involving a low thermal input flux into the polymer material should be used when forming the initial film of either electrode or functional material on the surface of the polymer memory material. For instance, the input of thermal energy to the polymer memory material in this stage could be kept well below a certain value to avoid build-up of thermal energy in a volume element of the memory material exceeding the heat of fusion thereof.

Once the memory material is coated by an initial thin film of either functional material or electrode material or an admixture therewith, the deposition process can continue with reliance on sufficient heat dissipation capacity in the already laid-down thin film such that the memory material is no longer detrimentally influenced. It should be noted that the above processual considerations generally apply irrespective of whether the functional material is provided admixed in the electrode material or laid down in a separate process forming a surface layer thereof or interlayers between the electrodes and the memory material, as e.g.

shown in FIG. 3. It should also be noted that the functional material can be deposited by means as briefly mentioned in conjunction with example 2 or example 5 above.

When a conducting polymer is used as a functional material this cannot be admixed with conventional, i.e. metallic, electrode material, but shall in any case be deposited at the surface thereof, thus forming an interlayer in the memory circuit of the invention. As mentioned in the introduction of the application and according to the prior art, attempts have been made using conducting polymer as the sole electrode material, i.e. thus avoiding metallic electrodes all together. Since, however, the conducting polymer will be chemically different from that of a polymer memory material, there may still be a possibility of a deterioration of either due to migration of mobile charged and/or neutral particles between either, the prevention of which being a major objective of the present invention. Hence in the case of employing electrodes of conducting polymer material only, the functional material advantageously can be incorporated in electrodes of this kind as dopants thereof, such that the electrodes now completely integrate the required conduction and charge transfer functions with the desired effects of a functional material, viz. the incorporation of atomic or molecular species contained in either the electrode material or the memory material and prone to migration therebetween.

Finally it should be noted that it also may be possible to avoid complications involved in a conventional metallization or deposition process for refractory electrode material by providing the second electrode with a functional material either incorporated or with one or more surface layers thereof in the third process step, involving the use of an additional not shown substrate or backplane of e.g. a suitable electrically insulating material, whereafter the second electrode layer and/or the functional material layers as applicable are laminated to the memory material in a low-temperature process. This could be particularly advantageous when also considering the fact that any diffusion of a functional material and/or electrode material into the memory material then can be largely eliminated.

As known to persons skilled in the art it should be understood that all layers of the memory circuit irrespective of whether they are electrode layers, a memory material layer or interlayers of functional material, can be deposited as thin films by any of the deposition processes mentioned herein. This should be obvious to persons skilled in the art and highly relevant, as e.g. ferroelectric memories based on organic material such as ferroelectric polymers are today envisaged as nothing but thin-film devices.

What is claimed is:

1. A ferroelectric or electret memory circuit, particularly a ferroelectric or electret memory circuit with improved fatigue resistance, comprising:

a memory cell with a ferroelectric or electret memory material exhibiting hysteresis and capable of being polarized to a positive or negative polarization state with a given polarization value, wherein the ferroelectric or electret memory material is a polymer or oligomer material, or blends or composites comprising materials of this kind; and first and second electrodes directly or indirectly contacting the memory material in an arrangement such that by applying appropriate voltages to the electrodes, a potential difference can be generated over the memory material for polarizing an unpolarized memory cell, or inducing a switching between a polarization states of the memory cell and the opposite polarization state, or inducing a temporary change in the polarization state or value thereof in the memory cell; wherein at least one of the first and second electrodes comprises at least one functional material selected among one or more of the following, viz. a diamond-like nanocomposite thin-film material, a conducting carbide material, a conducting oxide material, a conducting boride material, a conducting nitride material, a conducting silicide material, a conducting carbon-based material, or a conducting polymer or copolymer material, said at least one functional material being capable of physical and/or chemical bulk incorporation of atomic or molecular species contained in either the electrode material or the memory material of the memory cell and displaying a propensity for migrating in the form of mobile charged and/or neutral particles from an electrode material into the memory material or from the memory material into the electrode material, whereby an adverse effect on the functional properties of either the electrode material or the memory material of the memory cell can be offset.

2. A ferroelectric or electret memory circuit according to claim 1, wherein said at least one functional material either separately or in conjunction has electrical and/or chemical properties compatible with those of the electrode material.

3. A ferroelectric or electret memory circuit according to claim 1, wherein said at least one functional material has a relative permittivity about equal to or greater than that of the memory material.

4. A ferroelectric or electret memory circuit according to claim 1, wherein said at least one functional material has a relative permittivity that remains substantially unchanged upon incorporation of said atomic or molecular species.

5. A ferroelectric or electret memory circuit according to claim 1, wherein said at least one functional material has a conductivity that remains substantially unchanged upon incorporation of said atomic or molecular species.

6. A ferroelectric or electret memory circuit according to claim 1, wherein said at least one functional material is provided evenly distributed in the electrode material.

7. A ferroelectric or electret memory circuit according to claim 1, wherein said at least one functional material is provided in a portion of the electrode material extending to a surface of at least one of said first and second electrode and contacting the memory material.

8. A ferroelectric or electret memory circuit according to claim 7, two or more functional materials are provided in respective separate strata of said portion of the electrode material.

9. A ferroelectric or electret memory circuit according to claim 1, wherein said at least one functional material is provided in one or more surface layers of at least one of said first and second electrode, said one or more surface layers being provided as one or more interlayers between at least one of said first and second electrode and the memory material.

10. A ferroelectric or electret memory circuit according to claim 9, in wherein two or more functional materials are provided in respective two or more interlayers.

11. A ferroelectric or electret memory circuit according to claim 1, wherein said conducting carbide material is one or more of the following, viz. tantalum carbide, titanium carbide, zirconium carbide, or hafnium carbide.

12. A ferroelectric or electret memory circuit according to claim 1, wherein said conducting oxide material is one or more of the following, viz. binary oxides, ternary oxides, doped or undoped binary oxides, or doped or undoped ternary oxides.

13. A ferroelectric or electret memory circuit according to claim 1, wherein said conducting boride material being one or more of the following, viz. hafnium boride, zirconium boride, or chromium boride.

14. A ferroelectric or electret memory circuit according to claim 1, wherein said conducting nitride material is one or more of the following, viz. titanium nitride, zirconium nitride, hafnium nitride, tantalum nitride, vanadium nitride, niobium nitride or chromium nitride.

15. A ferroelectric or electret memory circuit according to claim 1, wherein said conducting silicide material is titanium silicide.

16. A ferroelectric or electret memory circuit according to claim 1, wherein said conducting carbon-based material is one or more of the following, viz. graphitic carbon, fullerenes or substances with cyano entities.

17. A ferroelectric or electret memory circuit according to claim 1, wherein the conducting polymer or copolymer material is selected as one or more of the following, viz. doped polypyrrole, doped derivatives of polypyrrole, doped polyaniline, doped derivatives of polyaniline, doped polythiophenes, and doped derivatives of polythiophenes.

18. A ferroelectric or electret memory circuit according to claim 1, wherein the ferroelectric or electret polymer memory material is selected as one or more of the following, viz. polyvinylidene fluoride, polyvinylidene with any of its copolymers, ter-polymers based on either copolymers or PVDF-trifluoroethylene, odd-numbered nylons, odd-numbered nylons with any of their copolymers, cyanopolymers, and cyanopolymers with any of their copolymers.

19. A ferroelectric or electret memory circuit according to claim 18, wherein the memory material, the first and second electrode and, if appropriate, said at least one interlayer all are provided as thin films in the memory circuit, thus realizing the latter as a substantially thin-film device.

20. A ferroelectric or electret memory circuit according to claim 1, wherein the electrode material being selected as one of the following materials, viz. aluminum, platinum, gold, titanium, copper, or alloys or composites thereof.

21. A ferroelectric or electret memory circuit according to claim 1, wherein the memory material is provided in the memory circuit by means of physical or chemical vapour deposition or by means of spin-or dip-coating processes, the electrode material being provided in the memory circuit by means of physical or chemical vapour deposition, and said at least one functional material being provided in the memory circuit by means of physical or chemical vapour deposition or a solution-based process.

22. A ferroelectric or electret memory circuit according to claim 1, wherein a plurality of such memory circuits forms the memory circuits in a matrix-addressable array, that the memory cells of the memory circuits form distinct portions in a global layer of a ferroelectric or electret thin-film memory material, the first and second electrodes form portions of first and second electrode means respectively, each electrode means including a plurality of parallel strip-like first and second electrodes with the electrodes of the second electrode means being oriented at an angle, preferably orthogonally, to the electrodes of the first electrode means, and that the ferroelectric or electret thin-film global layer is sandwiched therebetween, such that the memory cells of the memory circuits are defined in the thin-film global layer at the crossings of respectively the electrodes of the first electrode means and the electrodes of the second electrode means, whereby the array of memory circuits formed by the electrode means and the global layer of the memory material with the memory cells realizes an integrated passive matrix-addressable ferroelectric or electret memory device wherein the addressing of respective memory cells for write and read operations take place via the first and second electrodes of the electrode means in suitable connection with external circuitry for driving, control and detection.

* * * * *